(12) United States Patent
Okuma et al.

(10) Patent No.: US 11,021,788 B2
(45) Date of Patent: Jun. 1, 2021

(54) SPUTTERING METHOD

(71) Applicant: Panasonic Intellectual Property Management Co., Ltd., Osaka (JP)

(72) Inventors: Takafumi Okuma, Osaka (JP); Daisuke Suetsugu, Osaka (JP); Takahide Hirasaki, Kanagawa (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 39 days.

(21) Appl. No.: 16/205,166

(22) Filed: Nov. 29, 2018

(65) Prior Publication Data

US 2019/0169738 A1    Jun. 6, 2019

(30) Foreign Application Priority Data

Dec. 5, 2017  (JP) .............................. JP2017-233143
Sep. 5, 2018  (JP) .............................. JP2018-165882

(51) Int. Cl.
| | | |
|---|---|---|
| C23C 14/00 | (2006.01) | |
| C23C 14/06 | (2006.01) | |
| C23C 14/34 | (2006.01) | |
| H01L 21/02 | (2006.01) | |
| H01L 21/3205 | (2006.01) | |

(52) U.S. Cl.
CPC ...... *C23C 14/3485* (2013.01); *C23C 14/0036* (2013.01); *C23C 14/0641* (2013.01); *H01L 21/0217* (2013.01); *H01L 21/02175* (2013.01); *H01L 21/02178* (2013.01); *H01L 21/02183* (2013.01); *H01L 21/02186* (2013.01); *H01L 21/02266* (2013.01); *H01L 21/32051* (2013.01)

(58) Field of Classification Search
None
See application file for complete search history.

(56) References Cited

U.S. PATENT DOCUMENTS

| | | | |
|---|---|---|---|
| 2006/0246240 A1 | 11/2006 | Matsuda et al. | |
| 2012/0196137 A1 | 8/2012 | Vetter | |
| 2013/0056348 A1* | 3/2013 | Papa | C23C 14/14 |
| | | | 204/192.12 |
| 2014/0277571 A1 | 9/2014 | Pettersson et al. | |
| 2015/0167153 A1 | 6/2015 | Krassnitzer et al. | |
| 2015/0376056 A1 | 12/2015 | Damm et al. | |
| 2018/0064847 A1 | 3/2018 | Pettersson et al. | |

FOREIGN PATENT DOCUMENTS

| | | |
|---|---|---|
| JP | 2006-309995 | 11/2006 |
| JP | 2012-530188 | 11/2012 |
| JP | 5490368 B | 5/2014 |
| JP | 2014-525311 | 9/2014 |
| JP | 2016-517381 | 6/2016 |
| JP | 2016-141861 | 8/2016 |

\* cited by examiner

*Primary Examiner* — Jose I Hernandez-Kenney
(74) *Attorney, Agent, or Firm* — Wenderoth, Lind & Ponack, L.L.P.

(57) ABSTRACT

A sputtering method of forming a thin film by allowing a target material to react with a gas includes narrowing down film deposition conditions from an existing period of nitrogen radicals by focusing on a nitriding process in thin-film forming processes when the thin film is formed by pulsing a waveform of electric current from a DC power supply at the time of generating plasma and applying the electric current to the target material.

7 Claims, 6 Drawing Sheets

TIME AFTER PULSE APPLICATION [μsec]

SPUTTERING METHOD

TECHNICAL FIELD

The technical field relates to a sputtering method of forming a thin film with respect to a semiconductor wafer or a substrate made of glass or the like, and particularly relates to a technique of forming a dense nitride amorphous film in the sputtering method.

BACKGROUND

In recent years, attention is focused particularly on a technique concerning long-term performance stability, namely, improvement in reliability of devices in a device field of industrial application such as semiconductor devices and electronic components. High functionality of a control circuit and a safety circuit developed by hybridization of vehicles as well as diversification of sensors and control components due to realization of autonomous driving of vehicles may be cited as the background. The same trend can be seen also in industrial robots such as a welding machine, and many electronic components with high reliability are required.

There are various properties in which reliability is required in the device field according to applications. For example, heat resisting property of approximately 150° C. and environmental resistance with respect to the air are required for an application of vehicles as devices are arranged around an engine in many cases, and resistance to processing oil, resistance to electromagnetic waves and so on for an application of industrial robots may be cited.

When the device field is broadly classified into a field of semiconductor devices such as an LSI and an IC and a field of electronic components typified by a resistor, coils, a capacitor, a MEMS sensor and so on, the technique concerning reliability is relatively developing in advance in the field of semiconductor devices as compared with the field of electronic components. Semiconductors are formed by ultra-fine processing of several ten nanometer, and a strong protective film is necessary to maintain their performance with high accuracy. Silicon nitride is generally used most widely as a material of the protective film for preventing permeation of water or air. That is because combination between nitrogen and silicon is strong and the stability in environmental resistance is extremely high. The silicon nitride is formed by decomposing silane gas and ammonia by plasma or heat and depositing them on a device in a semiconductor factory. The silane gas is highly active and is an explosive hazard. The ammonia has a strong toxicity and is a gas difficult to be handled. As hazardous gases similar to the above are handled and a detoxifying apparatus for these gases is provided in the semiconductor factory, silicon nitride has a high affinity in a production line.

On the other hand, in the field of electronic components, a component having protection performance equivalent to that of the silicon nitride protective film which is widely used in semiconductor devices is not used. This is largely because there is no environment of handling hazardous gases described above. In order to introduce a process of silicon nitride by the same method as in the semiconductor factory, it is necessary to prepare the detoxifying apparatus or a measures infrastructure at the time of emergency for one process, which increases investment and it is difficult to realize that. As it is difficult to shift the increase in costs due to the investment onto prices, which makes practical realization further difficult.

Note that the protective film is used also in the field of electronic components. However, an alternative material is used as the above hazardous gases are prohibited to be used. For example, the protective film is formed by other materials such as silicon oxide or alumina. However, protection properties equivalent to those of silicon nitride are not obtained in either case, therefore, the protection is managed by increasing the film thickness in many cases, and the load on devices due to film stress and increase in cost due to increase in period of film deposition time are becoming problems.

In particular, it is necessary to supply a nitrogen source of silicon nitride from the nitrogen gas in a case of sputtering, however, it is known that nitrogen has a structure of a diatomic molecule with high stability and is not decomposed by plasma used in normal sputtering.

A technique called pulse sputtering aiming at realizing decomposition and activation of the nitrogen gas and forming an epitaxial film is proposed in recent years in sputtering (for example, see Japanese Patent No. 5490368 (JP 5490368)).

A pulse sputtering apparatus and pulse sputtering method in related art will be explained with reference to FIG. 6.

FIG. 6 is a cross-sectional view showing a structure of a related-art pulse sputtering apparatus 51 described in JP 5490368. A substrate electrode 54 and a target electrode 55 are arranged to face each other in a chamber 53 which can be evacuated. A substrate 52 is set on a surface of the substrate electrode 54 facing the target electrode 55 and a target material 56 is set on a surface of the target electrode 55 facing the substrate electrode 54. The pulse sputtering apparatus 51 is provided with a DC power supply 57 connecting to the substrate electrode 54 and the target electrode 55 and capable of applying a negative voltage to the target electrode 55 and a controller 58 applying a pulse waveform to the DC power supply 57. On a side surface of the chamber 53, a nitrogen supply source 59 used at the time of sputtering is provided. A mechanism for supplying other gases such as an argon gas other than nitrogen is also provided though not shown. A heating device 60 for heating the substrate 52 is provided on a surface of the substrate 54 on the opposite side of the substrate 52.

Next, a sputtering method using the related-art sputtering apparatus will be explained.

As the substrate 52, for example, single-crystal sapphire is used. A temperature of the substrate is heated to approximately 800° C. by using the heating device 60 for improving crystallinity. Hafnium is used as the target material 56. After the chamber 53 is evacuated and reaches a sufficient vacuum degree, the nitrogen gas and the argon gas are introduced and adjusted to be a prescribed pressure. After the temperature of the substrate 52 becomes stable, a pulse voltage is applied between the substrate electrode 54 and the target electrode 55. A pulse signal having the pulse voltage applied at this time is set so that a period in which the pulse voltage is applied is ⅕ or less than a period in which the pulse voltage is not applied. A frequency of the pulse signal is approximately 1 kHz.

During the period in which the pulse voltage is applied in the pulse signal, plasma is generated by the argon gas and collides with the target material 56, then, atoms included in the target material 56 are emitted and part thereof is adhered to a surface of the substrate 52. After that, the atoms do not reach the substrate 52 during the period in which the pulse voltage is not applied, therefore, plasma reacts with nitrogen radicals generated from the nitrogen gas and hafnium nitride is generated on the substrate 52 during the period.

That is, when the pulse voltage is applied by the pulse signal, atoms are sputtered from the target material 56 and the nitrogen radicals having high reactivity is generated at the same time, which causes nitriding reaction on the surface of the substrate 52 and forms an extremely thin nitride thin film. This is the reaction occurring in one period of the pulse signal, and the thin film is formed by repeating the above reaction.

It is difficult to adopt the above related-art sputtering method to the formation of the protective film for electronic components described in the beginning of the specification due to aspects of the process, equipment and productivity. Reasons thereof are described below.

First, restrictions in the process will be described. In the related-art sputtering method, it is necessary to heat the substrate in a range of 300 degrees or more to 1100 degrees or less for promoting migration of atoms on the substrate and allowing crystallization to proceed. The process of forming the protective film in the electronic component is naturally positioned at a stage close to the final stage after functions as a device are incorporated. In various materials and structure design of the electronic components, a temperature of solder reflow after mounting performed by a customer is set as the maximum temperature of the process in many cases. The temperature is approximately 150° C. even in in-vehicle components exposed to relatively high temperatures. In the above related-art example, a single-crystal substrate such as sapphire is used, which is for forming an LED and the like, therefore, there is a problem that it is difficult to be adapted to electronic components having low heat resistant temperatures.

Secondly, the aspect of equipment will be described. In the field of electronic components, requirement for reducing costs is extremely high. In the apparatus for realizing the above related-art example, the high-temperature heating device is particularly extremely expensive and an extremely high voltage is momentarily applied according to the relation between a pulse frequency and electric power, therefore, peripheries of power supply wiring such as a pulse generator increase equipment costs as compared with related-art sputtering apparatuses.

Thirdly, the aspect of productivity will be explained. The related-art example aims to laminate epitaxial films positively layer by layer on the single-crystal substrate, therefore, a film deposition rate is extremely slow. Re-evaporation from the surface also occurs in the related-art example as the substrate temperature is high, therefore, the film deposition rate is assumed to be approximately 1 to 5 nanometers per minute. Such film deposition rate is obviously insufficient as the film deposition rate of the protective film for the electronic component, and it is necessary to secure at least 10 nanometers or more per minute.

In the above related art sputtering method, optimum conditions are not capable of being found in a method in which experiments are made while reducing the substrate temperature and changing other parameters for applying the method to the manufacture of electronic components. In order to realize the sputtering of the nitride thin film as the protective film for electronic components handled in the present disclosure, it is essential to grasp the behavior of respective reactive species in plasma and to design an apparatus corresponding to characteristics of the behavior.

SUMMARY OF THE INVENTION

The present disclosure has been made for solving the above problems in the related-art sputtering method described above, and an object thereof is to provide a sputtering method capable of providing a high-quality thin film at a low cost with a simple apparatus structure.

A sputtering method according to an embodiment of the present disclosure is a sputtering method of an amorphous nitride thin film as a reactive sputtering method of forming a thin film by allowing a target material to react with a gas, which includes the steps of pulsing a waveform of electric current from a DC power supply at the time of generating plasma and applying the pulsed electric current to the target material, in which a pulse frequency of the waveform of the pulsed electric current is 10 kHz or more to 50 kHz of less, a ratio of a period in which a voltage is applied in one pulse period is 0.1% or more to 30% or less, a period in which the pulse is not applied is 15 microseconds or more and a sputtering pressure is 0.1 Pa or more to 0.3 Pa or less.

When adopting the sputtering method according to the present disclosure, a high-quality thin film can be provided at a low cost with a simple apparatus structure. In the sputtering method according to the present disclosure, generation and disappearance of nitrogen radicals in plasma as important factors are grasped on the time base in the formation of the nitride thin film by the sputtering method, thereby realizing improvement in film deposition rate while securing active species and reaction time for nitriding reaction, therefore, the formation of the protective film securing high reliability of electronic components can be realized with high quality and at a low cost. Accordingly, use of hazardous gases and the detoxifying apparatus or safety measures for them are not necessary in the sputtering method according to the present disclosure, and high-quality nitride protective film can be easily formed also at places other than semiconductor factories.

DESCRIPTION OF EMBODIMENTS

Initially, various aspects in the sputtering method according to the present disclosure will be described.

A sputtering method according to a first aspect of the present disclosure is a sputtering method of an amorphous nitride thin film as a reactive sputtering method of forming a thin film by allowing a target material to react with a gas, which includes the steps of pulsing a waveform of electric current from a DC power supply at the time of generating plasma and applying the pulsed electric current to the target material, in which a pulse frequency of the waveform of the pulsed electric current is 10 kHz or more to 50 kHz of less, a ratio of a period in which a voltage is applied in one pulse period is 0.1% or more to 30% or less, a period in which the pulse is not applied is 15 microseconds or more and a sputtering pressure is 0.1 Pa or more to 0.3 Pa or less.

In the sputtering method according to the first aspect, a high-quality thin film can be provided at a low cost with a simple apparatus structure, and improvement in film deposition rate can be realized while securing active species and reaction time for nitriding reaction. Therefore, the formation of a protective film securing high reliability of electronic components can be realized with high quality and at a low cost.

In the sputtering method according to a second aspect of the present disclosure, in the first aspect, the pulse frequency may be 20 kHz or more to 50 kHz or less.

In the sputtering method according to a third aspect of the present disclosure, in the first or the second aspects, the ratio of the period in which the voltage is applied in one pulse period may be 20% or more to 30% or less.

In the sputtering method according to a fourth aspect of the present disclosure, in any of the first to third aspects, the period in which the pulse is not applied may be 15 microseconds or more to 45 microseconds or less.

In the sputtering method according to a fifth aspect of the present disclosure, in any of the first to fourth aspects, the amorphous nitride thin film may be made of silicon nitride and the target material may be silicon.

In the sputtering method according to sixth aspect of the present disclosure, in any of the first to fifth aspects, the target material may contain a material of at least one kind of tantalum, niobium, chromium, aluminum and titanium.

Hereinafter, Embodiment 1 of the present disclosure will be explained in detail with reference to the attached drawings. Numerals, shapes, structures, steps, the order of steps and so on shown in Embodiment 1 are shown as examples and do not limit the present disclosure. In components in the following embodiments, components not described in independent claims showing the broadest concepts will be explained as arbitrary components.

Embodiment 1

First, a structure of a sputtering apparatus according to Embodiment 1 of the present disclosure will be explained mainly with reference to FIG. 1.

Figure 1:
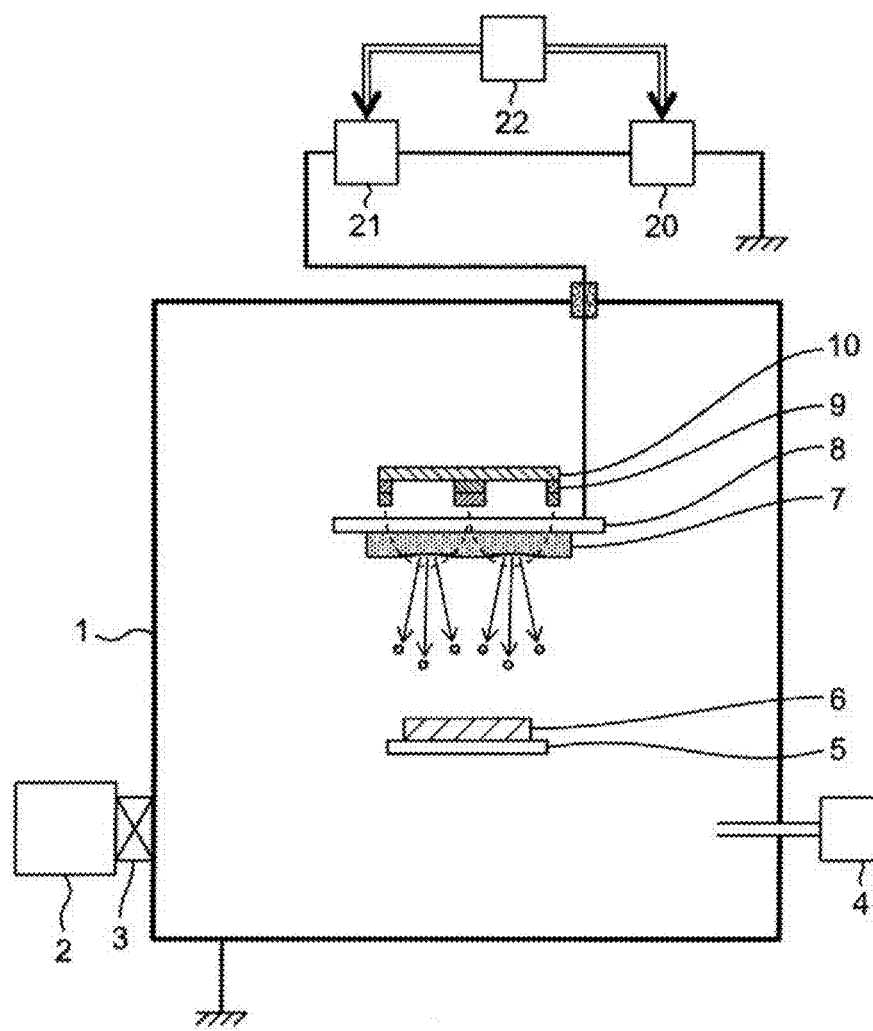
FIG. 1 is a cross-sectional view showing a schematic structure of a sputtering apparatus according to Embodiment 1 of the present disclosure.

FIG. 1 is a cross-sectional view showing a schematic structure of the sputtering apparatus according to Embodiment 1. The sputtering apparatus according to Embodiment 1 includes a vacuum chamber 1, a vacuum pump 2, a gas supply source 4, a backing plate 8, a DC power supply 20, a pulsing unit 21, a power supply/pulse controller 22 functioning as an example of a controller and a substrate holder 5.

The vacuum chamber 1 has a structure in which the inside of the vacuum chamber 1 is decompressed into a vacuum state by evacuating the vacuum chamber 1 by the vacuum pump 2 connected through a gate valve 3.

The gas supply source 4 can supply a gas necessary for sputtering to the vacuum chamber 1 at a constant rate. As a gas supplied from the gas supply source 4, for example, a gas having a reactivity with a target material such as nitrogen and oxygen or a mixed gas of the gas having the reactivity and a noble gas such as argon or the like can be selected.

The gate valve 3 provided in the vacuum chamber 1 can control the vacuum degree inside the vacuum chamber 1 to a desired gas pressure by changing an aperture of the gate valve 3.

As shown in FIG. 1, a target material 7 as a target material of sputtering is arranged at an upper part in the vacuum chamber 1. The target material 7 is an arbitrary sputtering material, which is for example, an inorganic material such as a metal material or a semiconductor material. In the case of Embodiment 1, the material is Si as an example.

The backing plate 8 is arranged at an upper part in the vacuum chamber 1, supporting the target material 7 so as to face the later-described substrate holder 5.

The DC power supply 20 is electrically connected to the target material 7 through the pulsing unit 21 and the backing plate 8, which can apply a voltage to the target material 7.

The pulsing unit 21 can accumulate DC current generated by the DC power supply 20 in a built-in capacitor or the like and can pulse the current by turning on or off the unit by a built-in semiconductor switching device or the like.

The power supply/pulse controller 22 controls a power value of the DC power supply 20 and a pulse frequency and on/off periods to be instructed to the pulsing unit 21 based on previously inputted setting values.

A magnet 9 and a yoke 10 are arranged on a back surface of the backing plate 8 at the upper part in the vacuum chamber 1, which can generate a magnetic field on a surface of the target material 7.

In FIG. 1, the substrate holder 5 supporting a substrate 6 is arranged at a lower part in the vacuum chamber 1. The substrate holder 5 is arranged under the substrate 6, supporting the substrate 6 so that the surface of the substrate 6 faces the surface of the target member 7 supported by the backing plate 8.

Next, a sputtering method of forming an amorphous nitride thin film using the sputtering apparatus according to Embodiment 1 will be described.

In the sputtering method according to Embodiment 1, a pulse wave in which the power is intensively applied for a short period of time such as approximately 10 microseconds is utilized as a method of applying the power for generating plasma in the reactive sputtering method. In a process of forming an oxynitride film by using a metal or semiconductor target, high power is momentarily applied by applying the power for generating plasma for a short period of time of approximately 10 microseconds. For example, when the same power is consumed intensively only in a period of $\frac{1}{100}$ of a pulse period as compared with DC sputtering using a continuous wave of 100 W, the power of 10000 W that is 100 times of the above is momentarily applied. When the high power is momentarily applied as described above, the nitrogen gas assumed to have relatively high dissociation energy and difficulty dissociating is promoted to be dissociated, and atomic nitrogen having high reactivity or nitrogen in a radical state is generated. Accordingly, nitriding of a thin film is promoted. As a result, a thin film having a high concentration ratio of nitrogen as compared with a thin film obtained by DC sputtering using the continuous wave can be obtained.

Next, important factors constructing the sputtering method of the amorphous nitride thin film according to Embodiment 1 will be explained.

The present inventors have considered that it is important to measure and grasp a period of time concerning generation and disappearance of nitrogen radicals which is a key of the reaction process for determining the pulse application conditions. A purpose of applying the power in the pulse state is to dissociate nitrogen and to increase the energy of sputtered particles sputtered from the target by reducing the period in which a pulse voltage is applied and increasing momentary effective power. A period in which the pulse voltage is not applied is time of migration in which sputtered particles reaching the substrate move to optimum positions and time for reaction with the nitrogen radicals at the same time. That is, in a case where sufficiently nitrided dense thin film is obtained, it is preferable that the period in which the pulse voltage is applied is reduced as short as possible and that the period in which the pulse voltage is not applied is taken sufficiently long. However, a film deposition rate becomes extremely slow in such control of the application period of the pulse voltage, which lacks practicability.

Accordingly, the present inventors have derived actual film deposition conditions, particularly, how long the period in which the pulse voltage is not applied should be secured by previously measuring timing at which nitrogen radicals are generated and how long it takes until the nitrogen radicals disappear.

Figure 2:
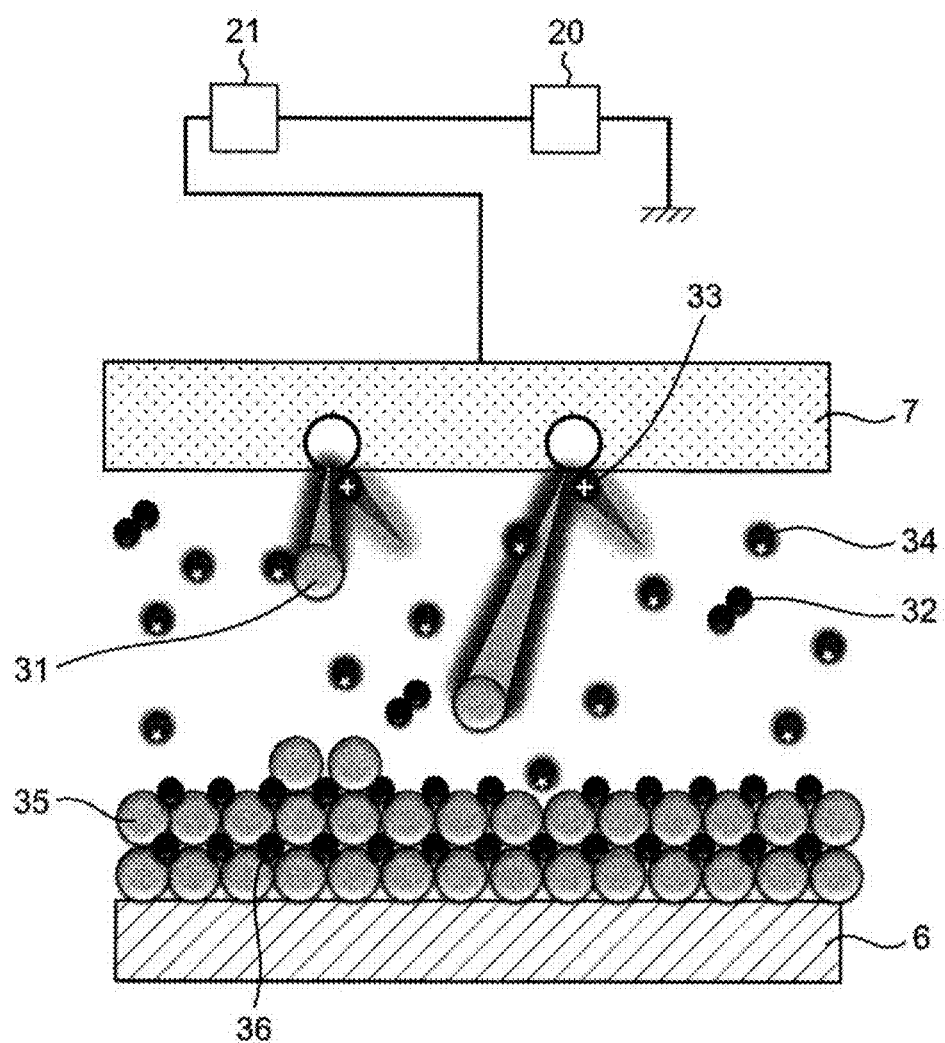
FIG. 2 is a schematic view schematically showing a sputtering process according to Embodiment 1 of the present disclosure.

FIG. 2 is a schematic view showing a sputtering process according to Embodiment 1 of the present disclosure. FIG. 2 schematically shows a state of a plasma space at the moment when the pulse voltage is applied. As the high power is momentarily applied, nitrogen molecules 32 in plasma are decomposed and activated to thereby generate atomic nitrogen, nitrogen radicals 34 and nitrogen ions 33. Among them, the nitrogen ions 33 are allowed to collide with the surface of the target material 7 due to a sheath potential gradient of plasma and sputtered silicon particles 31 as component atoms of the target material 7 are sputtered. Part of the ejected sputtered silicon particles 31 reaches the surface of the substrate 6 or the surface of a thin film already deposited on the substrate while having high energy. After that, the nitrogen radicals 34 collide and diffuse continuously after the pulse signal is turned off and react with silicon atoms reaching on the surface of the substrate 6 or the surface of the thin film already deposited on the substrate to thereby form silicon nitride. A silicon nitride thin film in which silicon atoms 35 and nitrogen atoms 36 are densely arranged is formed on the substrate 6 by the repetition of the above. In the reaction process, the nitrogen radicals 34 are reduced after the pulse signal is turned off due to combination with silicon or recombination with nitrogen radicals to each other, and then disappear. As the nitriding reaction does not occur after the nitrogen radicals disappear, to take the period in which the pulse voltage is not applied only decreases productivity.

Hereinafter, examination results based on measurement results concerning generation and disappearance of nitrogen radicals in the above sputtering process will be shown below.

Figure 3:
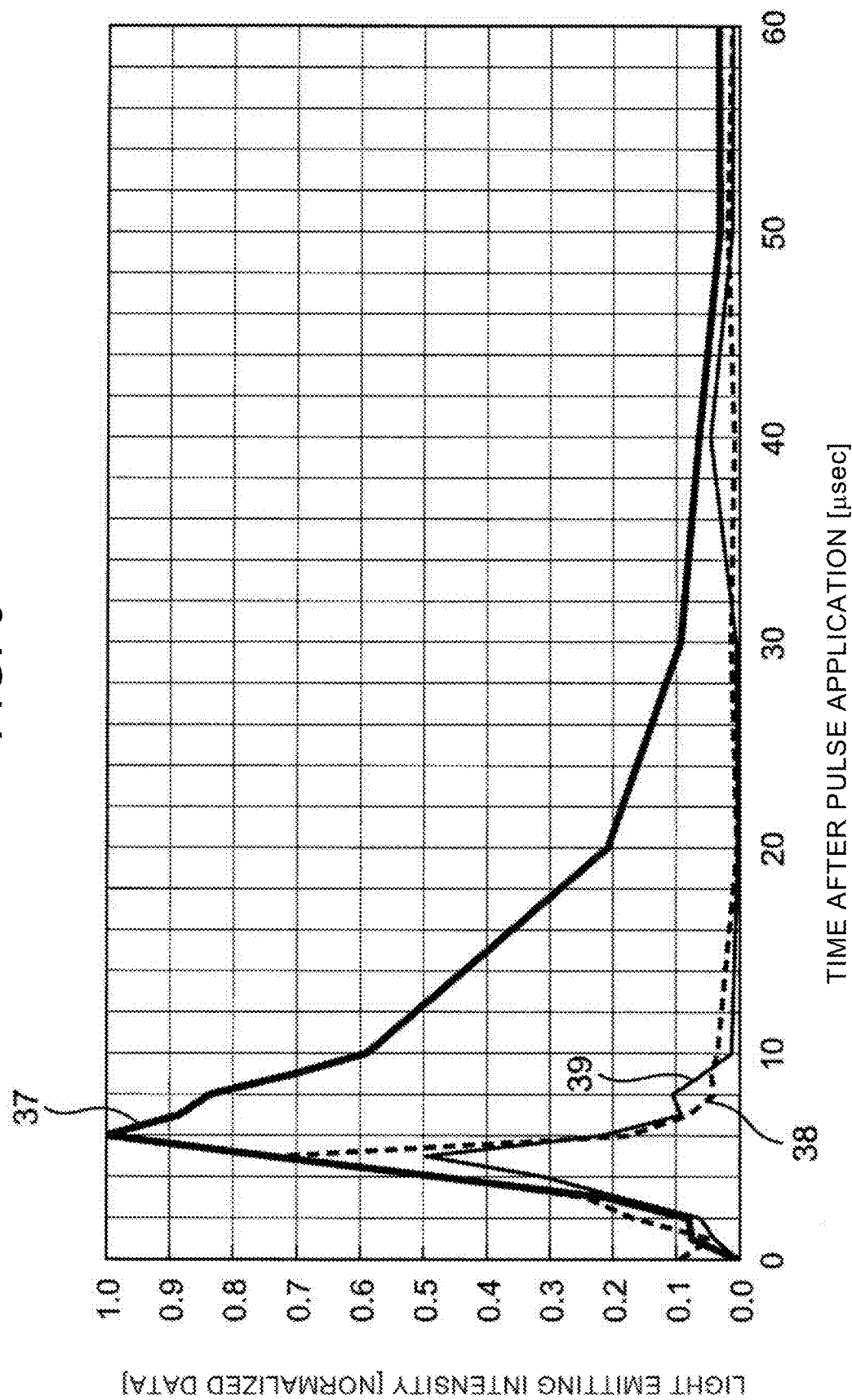
FIG. 3 shows results of measuring the behavior of plasma species according to Embodiment 1 of the present disclosure.

FIG. 3 shows results obtained by measuring generation and disappearance of nitrogen radicals. Si was used as the target material, the nitrogen gas was used as the gas and the argon gas was used for comparison. As pulse conditions, a frequency was 10 kHz and a duty ratio at which the power is applied was 5%. Temporal changes in light emitting intensity in plural wavelengths by using a gate ICCD camera and a precision spectroscope manufactured by Hamamatsu Photonics K.K. were measured. Here, the duty ratio in the present disclosure indicates a ratio of the period when the pulse is on (On-period) in a period of one pulse period. That is, 5% at the frequency of 10 kHz means 5% in 100 microseconds as one period, which corresponds to 5 microseconds.

In FIG. 3, the horizontal axis represents time from the moment when the pulse is applied (time after pulse-on) [unit: microsecond] and the vertical axis represents light emitting intensity in respective wavelengths (Intensity [normalized]). In the light emitting intensity in the vertical axis, normalization was performed by setting the maximum point to "1". In FIG. 3, a bold solid line represents a wavelength indicating a light emission 37 as a first positive of nitrogen, which corresponds to 61.8 nanometers. This is a characteristic light emitted when nitrogen radicals are recombined and returned to nitrogen molecules, and increase and decrease in amount of nitrogen radicals can be evaluated by this light emitting intensity. Similarly, a broken line in FIG. 3 represents a wavelength indicating a light emission 38 of silicon ions, which corresponds to 568.0 nanometers. This indicates an amount of ions sputtered from the target material and ionized in plasma. A thin solid line in FIG. 3 represents a wavelength indicating a light emission 39 of argon ions, which corresponds to 501. 5 nanometers.

The pulse voltage is applied at a point that the horizontal axis=0 and is turned off after 5 seconds. The light emission 38 of silicon ions and the light emission 39 of argon ions exceed the peak and begin to decrease at the same time when the pulse is turned off, which are not capable of being observed after several microseconds pass. On the other hand, it is found that the light emission 37 as the first positive of nitrogen increases for 1 microsecond after the pulse is turned off and decreases after that. It is found that the reduction is gradual and the light emission 37 continues to exist until observation becomes difficult at the vicinity of 50 microseconds. The fact that the light emission 37 as the first positive of the nitrogen exists even after the pulse is turned off indicates that nitrogen radicals exist in the space and nitriding reaction of silicon proceeds on the substrate. In other words, it is preferable to determine the pulse period by referring to the existing period of nitrogen radicals.

According to the above measurement results, it is necessary to secure at least 20 microseconds during which nitrogen radicals become 20%, that is, 15 microseconds after the pulse is turned off as a period in which the pulse voltage is not applied. It is further preferable to secure 50 microseconds during which nitrogen radicals are not observed, that is, 45 microseconds after the pulse is turned off as the period in which the pulse voltage is not applied. Considering control stability of the apparatus, a period of approximately 100 microseconds may be suitable as a long period of one pulse period.

That is, a period of one pulse is set to a range of 20 microseconds or more to 100 microseconds or less. That is, the pulse frequency is set to 10 kHz or more to 50 kHz or less. Further, it is preferable that the period of one pulse is set to a range of 20 microseconds or more to 50 microseconds or less. That is, it is preferable that the pulse frequency is set to 20 kHz or more to 50 kHz or less.

In the sputtering method according to Embodiment 1, at least a period of 15 microseconds or more is necessary as the period in which the pulse is not applied in one pulse period. Then, a period of 15 microseconds or more to 45 microseconds or less is more preferable as the period in which the pulse is not applied in one pulse period.

It is desirable that the ratio of the period in which the power is applied in one period (duty ratio) is a short period of time for achieving the object of applying high power momentarily as described above. However, in a point in which the duty ratio is less than 0.1%, the power is in the middle of rising and the period is insufficient for reaching the set power. From the vicinity of a point in which the duty ratio exceeds 30%, the above-described atomic nitrogen or nitrogen in the radical state formed due to dissociation of the nitrogen gas is reduced, and when the duty radio becomes approximately 50%, nitrogen is in approximately the same state as normal DC sputtering. Therefore, the ratio of the period in which power is applied in one cycle is preferably in a range of 0.1% or more to 30% or less.

Figure 4:
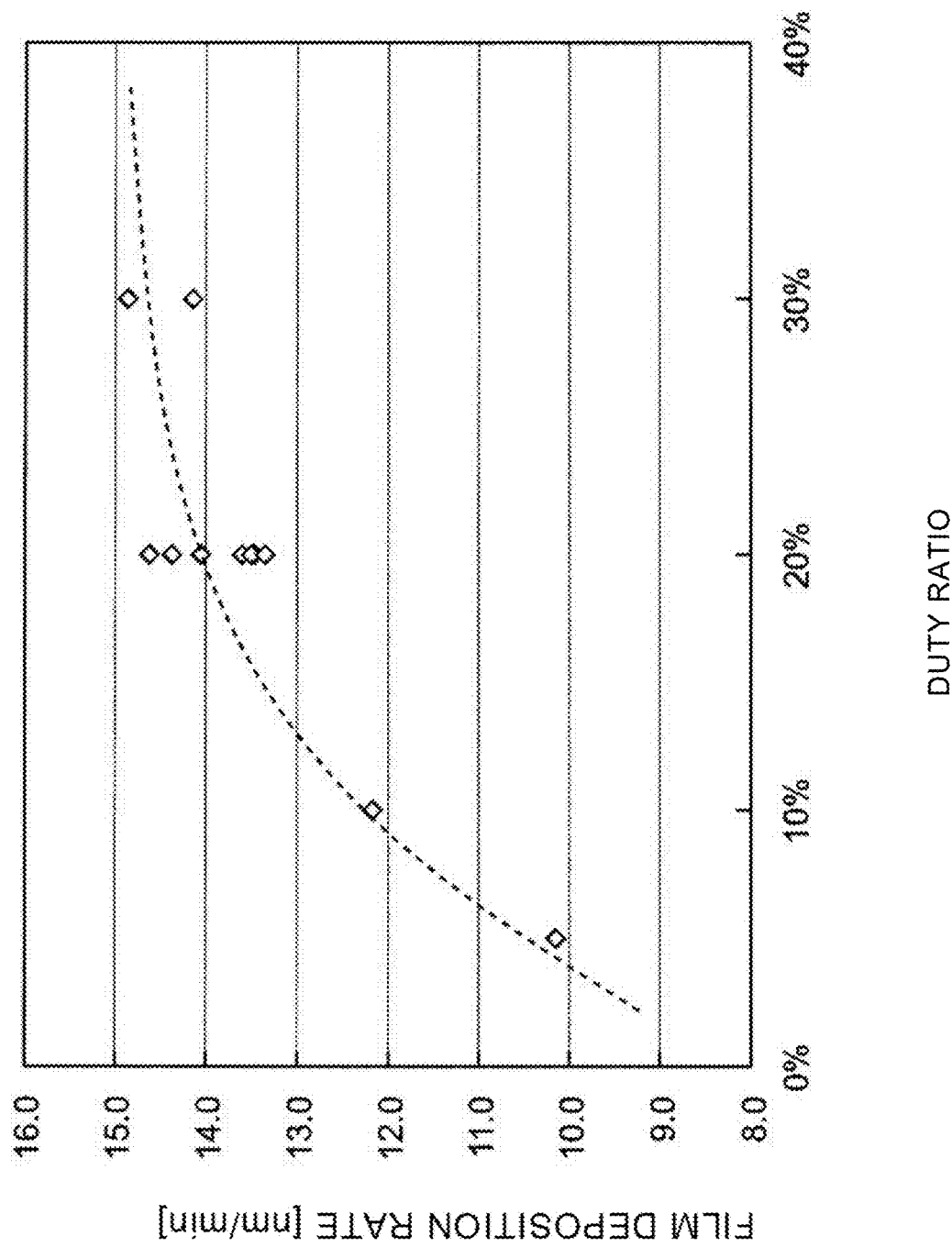
FIG. 4 is a graph of correlation between duty ratio and film deposition rate according to Embodiment 1 of the present disclosure.

Next, experimental results obtained by performing examination of the duty ratio for improving the film deposition rate are shown in FIG. 4. In this experiment, Si was used as the target material and only the nitrogen gas was used as the gas. Conditions of the pulse signal, a frequency was 10 kHz and a duty ratio at which the power is applied was 5% to 30%. A pressure was 0.3 Pa. In the graph of FIG. 4, the horizontal axis represents duty radio [%] and the vertical axis represents film deposition rate [nm/min]. As shown in the graph of FIG. 4, it is found that the film deposition rate is improved by increasing the duty ratio. On the other hand, it is found that it is not so effective when the duty radio is increased to 30 or more according to extrapolation lines in FIG. 4. According to the above, a range from 20% or more to 30% or less in duty ratio is effective concerning the film deposition rate.

Figure 5:
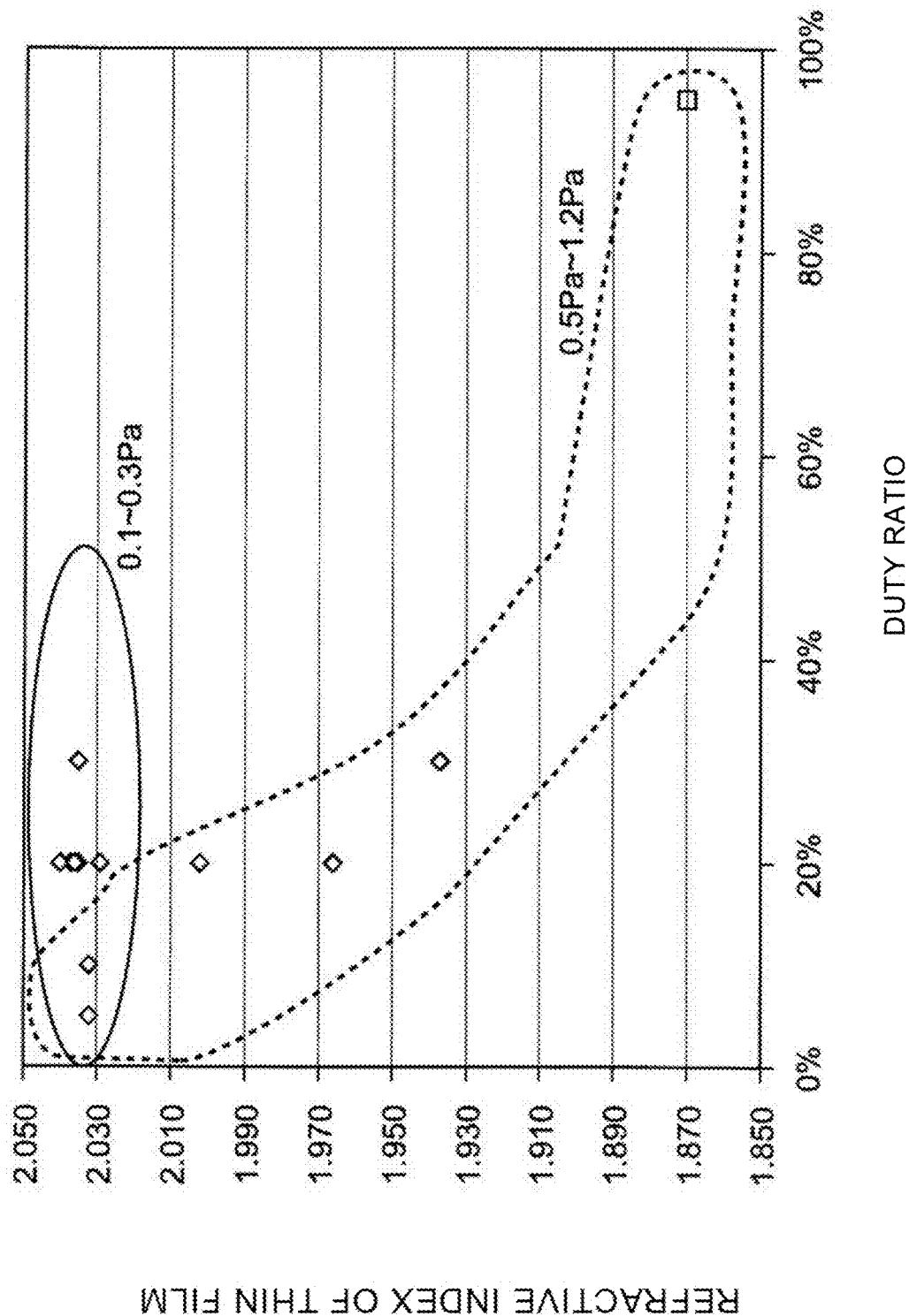
FIG. 5 is a graph of correlation between duty ratio and thin film refractive index according to Embodiment 1 of the present disclosure.
Figure 6:
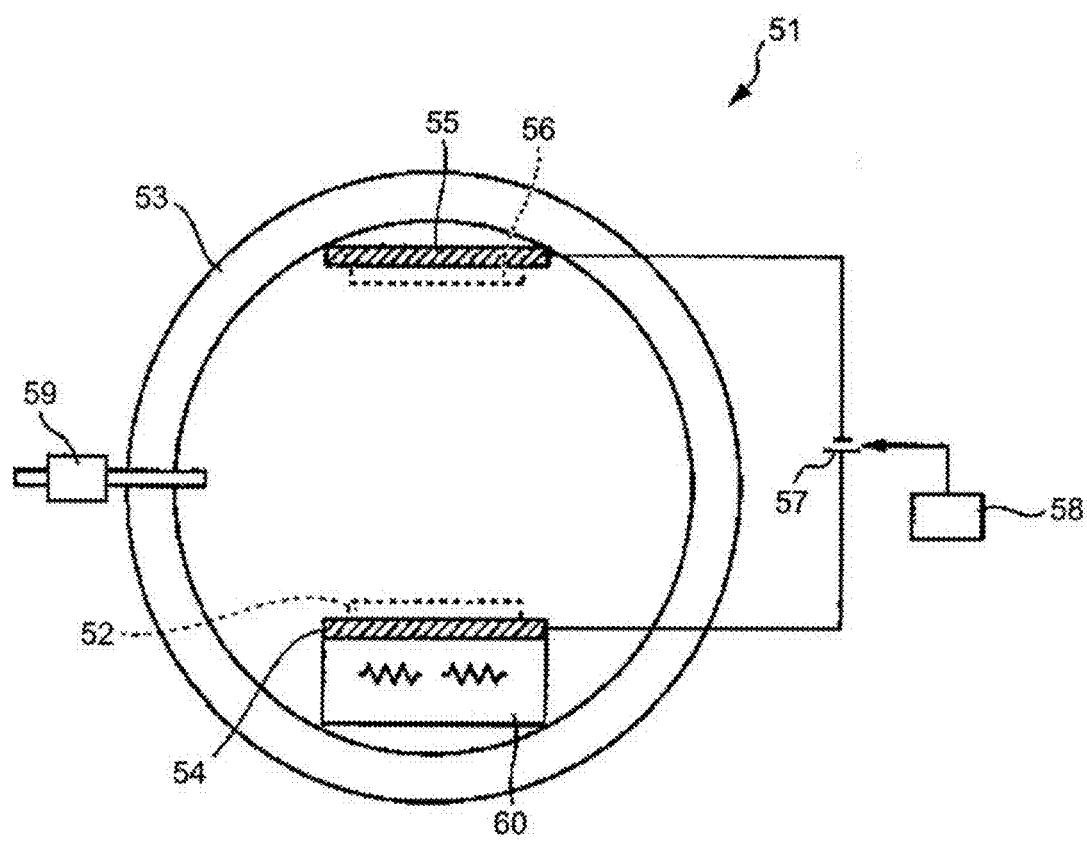
FIG. 6 is a cross-sectional view showing a schematic structure of a related-art pulse sputtering apparatus.

Results obtained by observing refractive indexes of thin films fabricated in the above experiment are shown in FIG. 5. The refractive index is widely used as an index indicating the density of a thin film which is the most effective and can be measured easily. In a case where composition of the thin film is not largely deviated, it can be determined that a film having a higher refractive index is denser. In a case of silicon nitride, films having refractive indexes in the vicinity of 2.02 to 2.03 are preferable.

In FIG. 5, the horizontal axis represents duty ratio [%] and the vertical axis represents refractive index of thin films. In the graph of FIG. 5, all films formed with different sputtering pressures are shown. According to the graph of FIG. 5, films with lower density are formed with increase in duty ratio in a condition in which the sputtering pressure is 0.5 Pa or more. On the other hand, in a condition in which the sputtering pressure is 0.3 Pa or less, it is found that quality is maintained when the duty ratio is increased. Combining the results with the above results of FIG. 4, it is found that the film deposition rate can be improved while maintaining the quality of the density of thin films by increasing the duty ratio in the condition that the sputtering pressure is 0.3 Pa or less. The lowest sputtering pressure in the experimental results was 0.1 Pa. In a condition that the sputtering pressure is lower than 0.1 Pa, plasma discharge became unstable and it was difficult to perform stable sputtering film deposition.

Here, concerning the frequency of the pulse signal in the pulse sputtering, it has been found that plasma discharge becomes extremely unstable on a low frequency side, for example, in a condition that the frequency is lower than 1 kHz, and that one cycle becomes approximately 10 microseconds and it is difficult to decrease the duty ratio to a desired value due to constraints of a power supply device on a high frequency side, for example, in a condition that the frequency exceeds 100 kHz in the examination by the present inventors. Accordingly, it can be considered that a suitable range of the frequency of the pulse signal is 1 kHz or more to 100 kHz or less.

In the sputtering method of the amorphous nitride thin film according to the present disclosure, the target material contains a material of at least one kind of tantalum, niobium, chromium, aluminum and titanium.

As described above, according to the present disclosure, generation and disappearance of nitrogen radicals in plasma as the important factors are grasped on the time base in the formation of the nitride thin film by the sputtering method, thereby realizing improvement in film deposition rate while securing active species and reaction time for nitriding reaction. Therefore, the formation of the protective film securing high reliability of electronic components can be realized with high quality and at a low cost. Accordingly, use of hazardous gases and the detoxifying apparatus or safety measures for them are not necessary, and high-quality nitride protective film can be easily formed also at places other than semiconductor factories.

It is difficult to fabricate the high-density film of the silicon nitride film as the protective film for securing reliability in electronic components and the like, and the film deposition rate is extremely slow in the related-art sputtering method, which are problems on practical use as described above. The present disclosure provides a breakthrough in a point that the behavior of nitrogen radicals as the most important factors for forming silicon nitride is observed and film deposition conditions are determined based on the behavior including the viewpoint of productivity.

In the sputtering method according to the present disclosure, the voltage is applied to the target in the pulse state for generating nitrogen radicals at high concentration, and invisible behavior such as the generation amount and existing time of nitrogen radicals which is extremely important for forming the nitride thin film is measured and grasped in detail, then, the results are reflected on film deposition conditions, thereby positively realizing nitriding reaction which is difficult in normal sputtering and stably forming the nitride thin film having components extremely close to a stoichiometric ratio at high speed by considering parameters concerning the film deposition rate within a range satisfying the above conditions.

The sputtering method according to the present disclosure allows the formation of the protective film formed of the nitride thin film which realizes high reliability suitable for electronic components by the apparatus having a simple structure, therefore, use of hazardous gases and expensive utilities such as the detoxifying apparatus relating to the gases are not necessary, which is effective as a method of forming a highly-functional inorganic protective film.

What is claimed is:

1. A sputtering method of forming an amorphous nitride film, comprising:
   determining pulsed electric current application conditions based on a pre-measured duration of nitrogen radicals generated from nitrogen gas by application of pulsed voltage;
   providing a target material in a chamber;
   supplying a nitrogen gas into the chamber;
   generating a plasma by pulsing a waveform of electric current from a DC power supply with the nitrogen gas present in the chamber; and
   applying the pulsed electric current to the target material to form the amorphous nitride film,
   wherein the pulsed electric current application conditions include a pulse frequency of the waveform of the pulsed electric current within a range of 10 kHz to 50 kHz inclusive, a ratio of a period in which a voltage is applied in one pulse period within a range of 0.1% to 30% inclusive, a period in which the pulse is not applied within a range of 15 microseconds to 45 microseconds inclusive, and a sputtering pressure within a range of 0.1 Pa to 0.3 Pa inclusive.

2. The sputtering method according to claim 1, wherein the pulse frequency is within a range of 20 kHz to 50 kHz inclusive.

3. The sputtering method according to claim 1, wherein the ratio of the period in which the voltage is applied in one pulse period is within a range of 20% to 30% inclusive.

4. The sputtering method according to claim 1, wherein target material is silicon to form the amorphous nitride thin film made of silicon nitride.

5. The sputtering method according to claim 1, wherein the target material contains at least one of tantalum, niobium, chromium, aluminum and titanium.

6. The sputtering method according to claim 1, wherein the chamber is a vacuum chamber, and the target material contains silicon.

7. The sputtering method according to claim 1, further comprising arranging a magnet at a back surface of the target material, and generating a magnetic field on a surface of the target material with the magnet.

\* \* \* \* \*